(12) United States Patent
Mcardle et al.

(10) Patent No.: US 9,349,864 B1
(45) Date of Patent: May 24, 2016

(54) METHODS FOR SELECTIVELY FORMING A LAYER OF INCREASED DOPANT CONCENTRATION

(71) Applicant: GLOBALFOUNDRIES, INC., Grand Cayman (KY)

(72) Inventors: Timothy James Mcardle, Hopewell Junction, NY (US); Judson Robert Holt, Wappingers Falls, NY (US); Churamani Gaire, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/826,477

(22) Filed: Aug. 14, 2015

(51) Int. Cl.
*H01L 21/02* (2006.01)
*H01L 29/78* (2006.01)
*H01L 29/66* (2006.01)
*H01L 21/225* (2006.01)
*H01L 21/324* (2006.01)

(52) U.S. Cl.
CPC ........ *H01L 29/7848* (2013.01); *H01L 21/0245* (2013.01); *H01L 21/02516* (2013.01); *H01L 21/02532* (2013.01); *H01L 21/02609* (2013.01); *H01L 21/2251* (2013.01); *H01L 21/324* (2013.01); *H01L 29/66636* (2013.01)

(58) Field of Classification Search
CPC ............. H01L 21/02365; H01L 21/02436; H01L 21/02441; H01L 21/02496; H01L 21/02499; H01L 21/02518; H01L 21/28506
See application file for complete search history.

(56) References Cited

U.S. PATENT DOCUMENTS

2014/0264558 A1* 9/2014 Chandra ................ H01L 29/36
257/329

\* cited by examiner

*Primary Examiner* — Cheung Lee
(74) *Attorney, Agent, or Firm* — Ingrassia Fisher & Lorenz, P.C.

(57) ABSTRACT

Methods for fabricating integrated circuits including selectively forming layers of increased dopant concentration are provided. In an embodiment, a method for fabricating an integrated circuit includes forming a material layer with a selected facet on a selected plane and a non-selected facet on a non-selected plane. The method further includes performing an epitaxial deposition process with a dopant source to grow an in-situ doped epitaxial material on the material layer. The epitaxial deposition process grows the in-situ doped epitaxial material on the selected facet at a first growth rate and over the non-selected facet at a second growth rate greater than the first growth rate. A layer of increased dopant concentration is selectively formed over the selected facet.

20 Claims, 5 Drawing Sheets

US 9,349,864 B1

METHODS FOR SELECTIVELY FORMING A LAYER OF INCREASED DOPANT CONCENTRATION

TECHNICAL FIELD

The technical field generally relates to methods for fabricating integrated circuits, and more particularly relates to methods for fabricating integrated circuits that include selectively forming layers of increased dopant concentration.

BACKGROUND

Size reduction of metal-oxide-semiconductor field-effect transistors (MOSFETs) has enabled continued improvement in speed, performance, density, and cost per unit function of integrated circuits. One way to further improve MOSFET performance is through selective application of stress to the transistor channel region. Stress distorts (i.e., strains) the semiconductor crystal lattice, and the distortion, in turn, affects the band alignment and charge transport properties of the semiconductor. By controlling the magnitude and distribution of stress in a finished device, carrier mobility (e.g., electron or hole mobility) can be increased and this improves device performance.

One approach of introducing stress in the transistor channel region includes growing an epitaxial layer of silicon germanium within recesses in the source/drain regions. In this approach, lattice mismatch between the epitaxial silicon germanium and the silicon substrate is used to create a uni-axial compressive stress within the channel region, which results in enhanced hole mobility. This occurs because the silicon germanium lattice constant is greater than the underlying substrate lattice constant.

High germanium concentration in epitaxial silicon germanium may be needed to effectively boost channel compressive strain in PMOS devices. Dopant atoms such as boron may be incorporated into the epitaxial silicon germanium to provide the required semiconductor doping to form source/drain regions of the P-type transistor, and to lower sheet resistance and thus improve contact resistance in the silicon germanium source drain regions. However, as technology nodes scale, it is increasingly difficult to precisely locate dopant atoms. Specifically, in conventional processing, dopant placement accuracy is limited to dimensions defined by lithography photomasks. Semiconductor areas are masked and dopant is either introduced through implantation or epitaxy. Either method is limited by the masking precision.

Accordingly, it is desirable to provide a method for fabricating an integrated circuit in which a layer of increased dopant concentration is formed without limitation of lithography photomasks. Further, it is desirable to provide a method for fabricating an integrated circuit in which formation of a layer of increased dopant concentration is controlled via different epitaxial growth rates on different crystalline planes. Furthermore, other desirable features and characteristics will become apparent from the subsequent detailed description and the appended claims, taken in conjunction with the accompanying drawings and this background.

BRIEF SUMMARY

Methods for fabricating integrated circuits including selectively forming layers of increased dopant concentration are provided. In an embodiment, a method for fabricating an integrated circuit includes forming a material layer with a selected facet on a selected plane and a non-selected facet on a non-selected plane. The method further includes performing an epitaxial deposition process with a dopant source to grow an in-situ doped epitaxial material on the material layer. During the epitaxial deposition process, the in-situ doped epitaxial material grows on the selected facet at a first growth rate and grows over the non-selected facet at a second growth rate greater than the first growth rate. A layer of increased dopant concentration is selectively formed over the selected facet.

In another exemplary embodiment, a method for fabricating an integrated circuit includes establishing a selected facet on a selected plane and a non-selected surface in and/or overlying a semiconductor substrate. The method performs an epitaxial deposition process with a dopant source to grow an in-situ doped epitaxial material on the non-selected surface. The epitaxial deposition process selectively deposits interstitial dopant atoms over the selected facet to form a layer of increased dopant concentration over the selected facet.

In yet another exemplary embodiment, a method for fabricating an integrated circuit includes providing a semiconductor substrate. The method includes etching the semiconductor substrate to form a cavity and epitaxially growing a buffer material in the cavity. A selected facet on the (111) plane and a non-selected surface are defined within the cavity. The method also includes performing an epitaxial deposition process with a boron source to grow an in-situ boron-doped epitaxial material in the cavity. The epitaxial deposition process grows the in-situ boron-doped epitaxial material over the selected facet at a first growth rate and over the non-selected surface at a second growth rate greater than the first growth rate. Also, the epitaxial deposition process selectively forms a layer of increased boron concentration over the selected facet. Further, the method includes performing another epitaxial deposition process to grow an additional epitaxial material on the in-situ doped epitaxial material, performing a further epitaxial deposition process to grow a capping epitaxial material over the additional epitaxial material, and thermally annealing the semiconductor substrate to diffuse boron from the layer of increased boron concentration into the semiconductor substrate.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
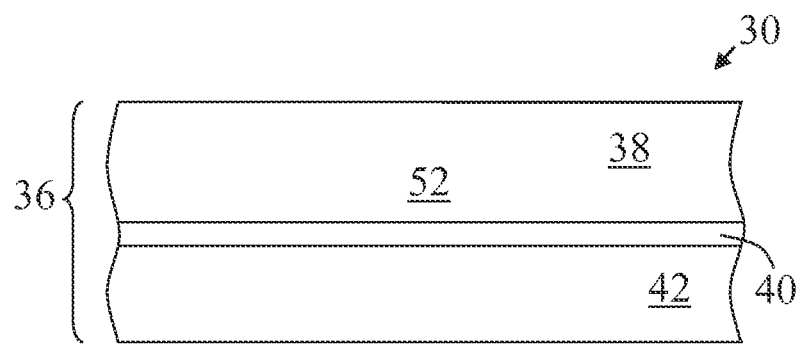
FIGS. 1-12 illustrate, in cross section, exemplary methods for fabricating an integrated circuit including forming layers of increased dopant concentration.

The following detailed description is merely exemplary in nature and is not intended to limit the methods for fabricating an integrated circuit or for forming layers of increased dopant concentration. Furthermore, there is no intention to be bound by any expressed or implied theory presented in the preceding technical field, background or brief summary, or in the following detailed description.

For the sake of brevity, conventional techniques related to integrated circuit device fabrication may not be described in detail herein. Moreover, the various tasks and processes described herein may be incorporated into a more comprehensive procedure or process having additional steps or functionality not described in detail herein. In particular, various steps in the fabrication of integrated circuits are well-known and so, in the interest of brevity, many conventional steps will only be mentioned briefly herein or will be omitted entirely without providing the well-known process details.

As used herein, it will be understood that when an element or layer is referred to as being "over" another element or layer, it may be directly on the other element or layer, or intervening elements or layers may be present. When an element or layer is referred to as being "on" another element or layer, it is directly on and in contact with the other element or layer. Further, spatially relative terms, such as "bottom", "side", "downward-facing", "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass either an orientation of above or below. The device may be otherwise oriented (rotated 90 degrees or at other orientations) and the spatially relative descriptors used herein may likewise be interpreted accordingly.

Monocrystalline silicon, the most common semiconductor material used in the semiconductor industry for the fabrication of semiconductor devices and integrated circuits is characterized by a lattice constant, i.e., a dimension of the silicon crystal. By substituting atoms other than silicon in a crystal lattice, the size of the resulting crystal and the lattice constant can be changed. If a larger substitutional atom such as a germanium atom is added to the silicon lattice at a position where a silicon atom is removed, the lattice constant increases and the increase in lattice constant is proportional to the concentration of the substitutional atom. Similarly, if a smaller substitutional atom such as a carbon atom is added to the silicon lattice at a position where a silicon atom is removed, the lattice constant decreases. Locally adding a large substitutional atom to a host silicon lattice creates a compressive stress on the host lattice and adding a small substitutional atom to a host silicon lattice creates a tensile stress on the host lattice.

Semiconductor materials may also be doped to incorporate atoms in non-substitutional positions. Specifically, dopant atoms may be positioned, at least for a short or temporary time period, at interstitial positions in the host lattice without requiring loss of a host atom. Doping by interstitial impurities has not been proven to be effective in the prior art.

Exemplary methods provided herein utilize substitutional and interstitial doping to selectively form layers of increased dopant concentration. Specifically, epitaxial material is grown under conditions in which growth rates differ on different crystalline planes. On crystalline planes having high epitaxial growth rates, epitaxial material is grown with a standard or typical amount of dopant through substitutional doping. On a crystalline plane having low epitaxial growth rates, little epitaxial material with substitutional dopant is grown. However, on such a crystalline plane, interstitial dopant atoms are believed to accumulate or condense, resulting in a layer of increased dopant concentration.

In methods provided herein, dopant placement accuracy is not limited to dimensions defined by lithography photomasks, as in conventional methods. Rather, dopant is introduced preferentially to specific locations of epitaxial material through the utilization of different crystalline plane growth rates.

Exemplary methods provided herein utilize the selective formation of layers of increased dopant concentration to selective position the dopant in an integrated circuit structure before diffusing the dopant, such as during a thermal anneal process. Diffusion from the precise location of increased dopant concentration allows for the omission of later implant processing such as halo or extension implantation used in conventional methods.

Figure 5:
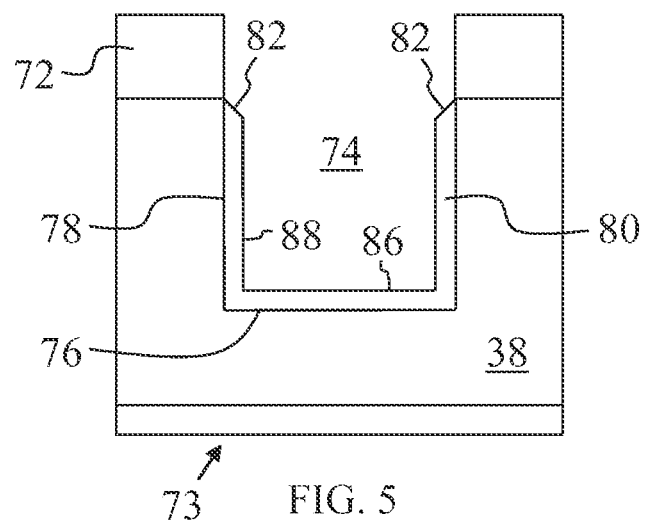
Figure 6:
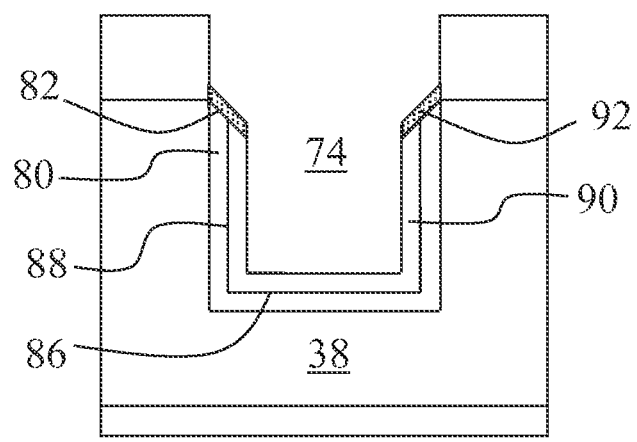
Figure 7:
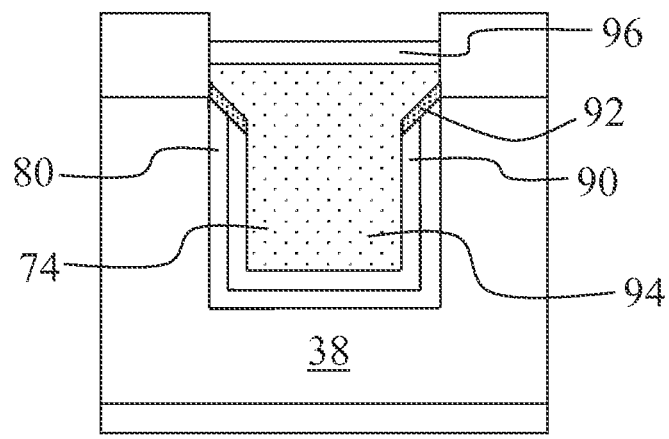
Figure 9:
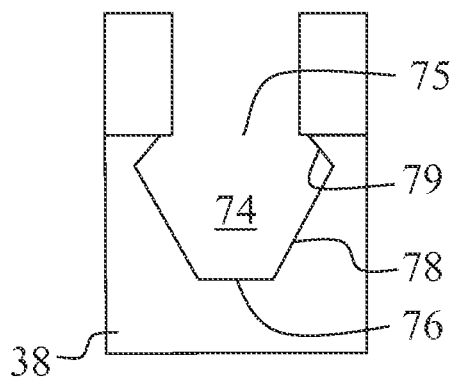
Figure 10:
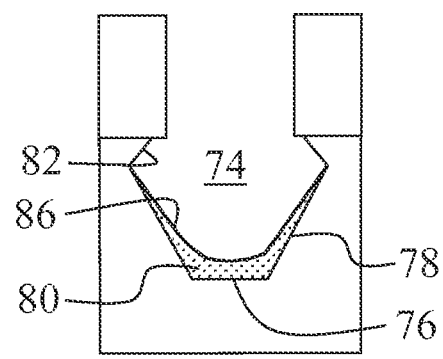
Figure 11:
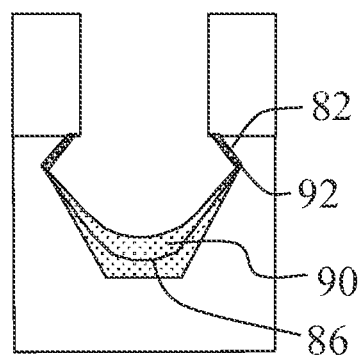
Figure 12:
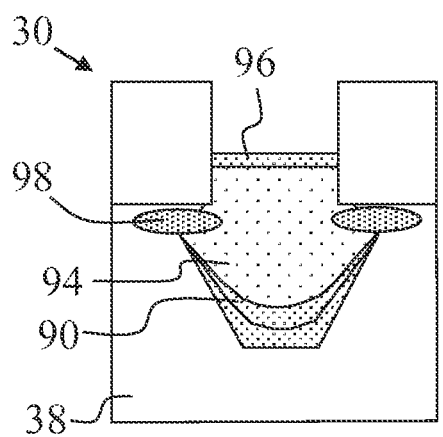

In accordance with the various embodiments herein, methods for fabricating integrated circuits include formation of layers of increased dopant concentration. FIGS. 1-4 illustrate an exemplary technique for the formation of a trench in a semiconductor substrate in accordance with an embodiment herein. FIGS. 5-7 illustrate an exemplary technique for the formation of a layer of increased dopant concentration over the semiconductor substrate of FIGS. 1-4 and FIG. 8 illustrates diffusion of the dopant from the layer of increased dopant concentration of FIG. 7. FIGS. 9-11 illustrate an exemplary technique for the formation of a layer of increased dopant concentration over the semiconductor substrate in an exemplary embodiment in which a sigma-shaped trench has been etched in the active region of the semiconductor substrate and FIG. 12 illustrate diffusion of the dopant from the layer of increased dopant concentration in the embodiment of FIG. 11.

As illustrated in FIG. 1, the fabrication of an integrated circuit 30 in accordance with an embodiment herein includes providing a semiconductor substrate 36 in and/or on which such integrated circuits are fabricated. The initial processes in the fabrication of the integrated circuit 30 are conventional and will not be described in detail. An exemplary semiconductor substrate is a silicon substrate having a (100) surface crystal orientation wherein the term "silicon substrate" and "silicon layer" are used herein to encompass the relatively pure monocrystalline silicon materials typically used in the semiconductor industry as well as silicon admixed with other elements such as germanium, carbon, and the like. Semiconductor substrate 36 will hereinafter be referred to for convenience but without limitation as a silicon substrate although those of skill in the semiconductor art will appreciate that other semiconductor materials could be used. Semiconductor substrate 36 may be a bulk silicon wafer (not illustrated) or a thin monocrystalline layer of silicon 38 on an insulating layer 40 (commonly known as silicon-on-insulator or SOI) that, in turn, is supported by a carrier wafer 42. Thin silicon layer 38 typically has a thickness of less than about 200 nanometers (nm) depending on the circuit function being implemented, and in certain applications has a thickness of less than about 90 nm. The thin silicon layer 38 may have a resistivity of from about 5 to about 40 Ohm centimeter. The silicon may be doped with either N-type or P-type impurities. An exemplary dielectric insulating layer 40, such as for example silicon dioxide, may have a thickness of from about 50 to about 200 nm.

Isolation regions (not shown) may be formed and may extend through the silicon layer 38 to dielectric insulating layer 40. Exemplary isolation regions are formed by conventional shallow trench isolation (STI) techniques. Either before or after fabrication of STI regions, selected portions of silicon layer 38 can be impurity doped, for example by ion implantation. For example, a well 52 can be doped with N-type impurities for the fabrication of a PMOS transistor or with P-type impurities for the fabrication of a NMOS transistor in the integrated circuit 30.

Figure 2:
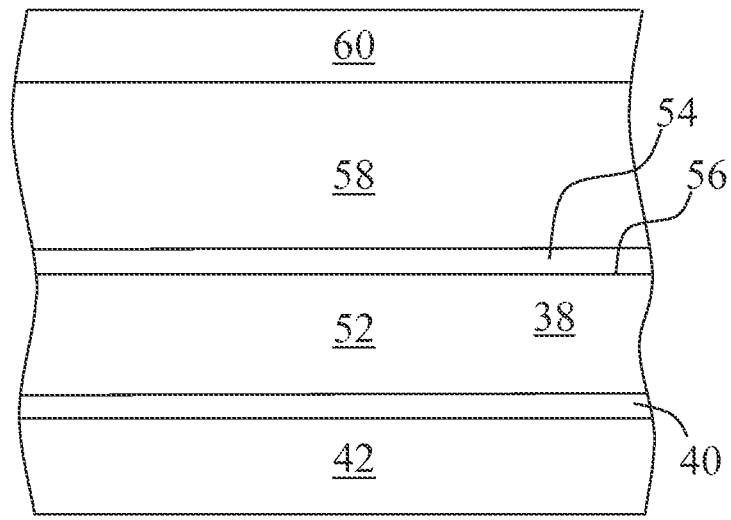

In an exemplary embodiment, a layer of gate insulator 54 is formed on a surface 56 of the silicon layer 38 as illustrated in FIG. 2. The gate insulator 54 may be thermally grown silicon dioxide formed by heating the semiconductor substrate 36 in an oxidizing ambient, or may be a deposited insulator such as a silicon oxide, silicon nitride, a high dielectric constant insulator such as hafnium silicon oxide, or the like. Deposited insulators can be deposited in known manner, for example, by chemical vapor deposition (CVD), low pressure chemical vapor deposition (LPCVD), semi-atmospheric chemical vapor deposition (SACVD), or plasma enhanced chemical vapor deposition (PECVD). Gate insulator 54 is illustrated as a thermally grown silicon dioxide layer. The gate insulator 54 may be from about 1 to about 10 nm in thickness. In accordance with one embodiment herein a layer of gate electrode forming material 58, such as polycrystalline silicon, is deposited onto the layer of gate insulator 54. Other electrically conductive gate electrode forming materials such as metals and metal silicides may also be deposited. The gate electrode forming material 58 will hereinafter be referred to as polycrystalline silicon although those of skill in the art will recognize that other materials can be employed. If the gate electrode forming material 58 is polycrystalline silicon, that material is typically deposited to a thickness of from about 50 to about 200 nm. In an exemplary embodiment, the polycrystalline silicon is deposited to a thickness of about 100 nm by LPCVD through the hydrogen reduction of silane. In an exemplary embodiment, the layer of polycrystalline silicon is deposited as undoped polycrystalline silicon and is subsequently impurity doped by ion implantation. A layer of hard mask material 60 such as a layer of silicon nitride is deposited over the polycrystalline silicon gate electrode forming material 58. The layer of hard mask material 60, if silicon nitride, can be deposited, for example, by PECVD to a thickness of from about 30 to about 50 nm from the reaction of dichlorosilane and ammonia. Dielectric materials other than silicon nitride can be deposited as the hard mask material 60.

Figure 3:
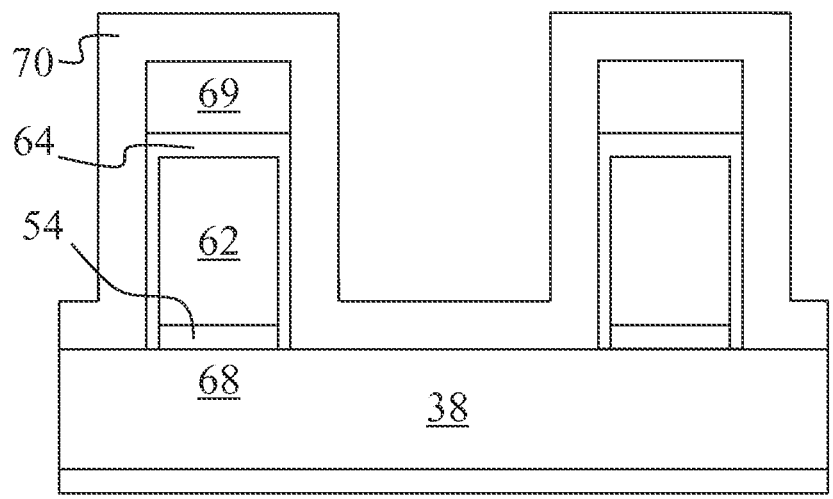

Hard mask material 60, gate electrode forming material 58, and gate insulator 54 are patterned by photolithography and etched to form gate electrodes 62 according to conventional processes. Etching in the desired pattern can be accomplished by, for example, plasma etching. Thereafter the hard mask material 60 is removed, and a liner 64, such as a silicon oxide liner, is formed over the top and along the sidewalls of each gate electrode 62, as is shown in FIG. 3. Thin oxide liner 64 separates the polycrystalline silicon gate electrode from subsequently deposited spacer forming materials. The silicon oxide liner 64 can have a thickness, for example, of about 2 to about 3 nm. The formation of gate electrode 62 defines a channel region 68 as that portion of the thin silicon layer 38 underlying the gate electrodes 62. In an exemplary embodiment, the channel region 68 is oriented along a [110] crystal direction so that current flow in the transistor will be in the [110] crystal direction. Further, a cap 69, such as for example a silicon nitride cap, is deposited over the liner 64. The method in accordance with one embodiment herein continues by blanket depositing a layer of spacer-forming material 70, such as silicon nitride, overlying cap 69 and liner 64. If of the same material, the cap 69 and spacer-forming material 70 may be considered to be merged as shown in the subsequent Figures. An exemplary silicon nitride layer 70 is deposited to a thickness of from about 80 to about 250 nm, such as by LPCVD using dichlorosilane and ammonia as reactants.

Figure 4:
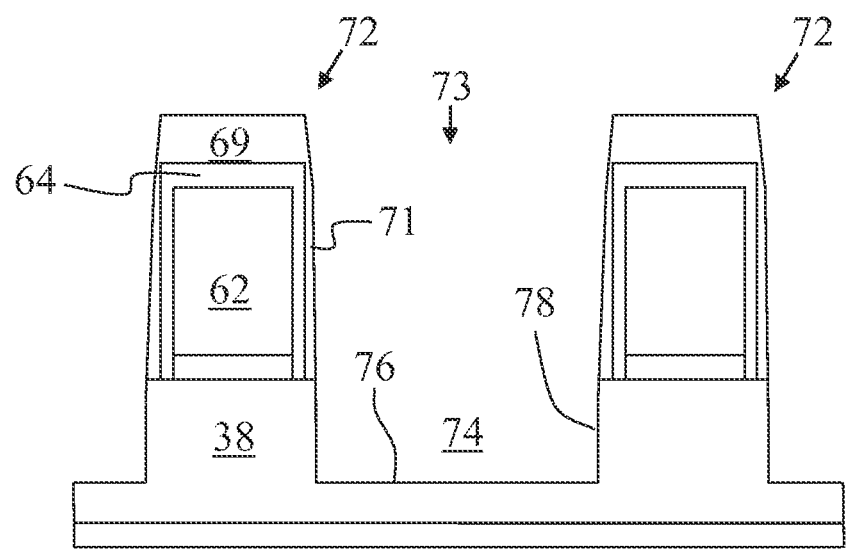

As shown in FIG. 4, the spacer-forming material 70 is anisotropically etched to form spacers 71. The etch may be performed anisotropically, for example by reactive ion etching (RIE), to create spacers 71. The spacers 71, cap 69, liner 64, and gate electrode 62 form gate structures 72. An active region 73 of the silicon layer 38 is defined between the gate structures 72.

In FIG. 4, cavities 74 are etched into the active region 73 of the thin silicon layer 38 using the gate structures 72 as etch masks. The cavities 74 are self-aligned to the gate structures 72 and are spaced apart from the channel region 68 under the gate electrode 62. In an exemplary embodiment, cavities 74 are anisotropically etched, for example, by reactive ion etching (RIE), for example using a $HBr/O_2$ chemistry for monocrystalline silicon, to a depth of from about 10 to about 20 nm. The exemplary trench formed in FIG. 4 is defined by a bottom surface 76 and side surfaces 78 formed from the silicon layer 38. In the illustrated embodiment, at least a thin portion of silicon layer 38 is left beneath bottom surface 76 of the cavities 74.

FIGS. 5-8 focus on the cavity 74 formed between the gate structures 72. In accordance with an embodiment herein, a material layer 80 is formed in the cavity 74 in FIG. 5. The material layer 80 may serve as a buffer layer to facilitate deposition of overlying layers. An exemplary material layer 80 is formed with a thickness of from about 1 nm to about 10 nm. In an exemplary embodiment, an epitaxial material is grown on the bottom surface 76 and side surfaces 78 of the cavity 74 to form the material layer 80. The epitaxial material may be silicon germanium (SiGe) having a germanium content of from about 5% to about 25% (by weight based on the total weight of the material). An exemplary epitaxial material is not doped, or is lightly doped, with n-type or p-type impurities. The epitaxial material may have a dopant content of no more than about $1E20$ $cm^{-3}$. The epitaxial material may be grown under process conditions such as a temperature of from about 550 to about 750° C., a pressure of from about 50 to about 300 Torr (T), with a mixture of process gases including diclorosilane (DCS), germane ($GeH_4$), diborane ($B_2H_6$), hydrogen chloride (HCl) and/or hydrogen ($H_2$).

During the epitaxial deposition process, the material layer 80 grows along crystalline planes to form selected facets 82. Selected facets 82 are formed on the (111) crystalline plane. The material layer 80 also forms non-selected facets on surfaces 86 and 88 along non-selected planes. In the illustrated embodiment, the surface 86 is formed along the (100) plane and the surface 88 is formed along the (110) plane.

In FIG. 6, an epitaxial deposition process is performed with processing conditions different from those of FIG. 5. For example, in FIG. 6 a flow of a dopant source into the cavity 74 is commenced, or increased from the process of FIG. 5. In an exemplary embodiment, the dopant source is a boron source such as $B_2H_6$, $B_4H_9$, and/or $B_5H_{10}$. The epitaxial deposition process may be performed at process conditions including a temperature of from about 550 to about 750° C., a pressure of from about 1 to about 100 T, and with a mixture of process gases including diclorosilane (DCS), germane ($GeH_4$), diborane ($B_2H_6$), hydrogen chloride (HCl) and/or hydrogen ($H_2$).

As shown, a layer 90 of in-situ doped epitaxial material, such as in-situ boron-doped epitaxial SiGe material, is formed on the material layer 80 in FIG. 6 as a result of the epitaxial deposition process. An exemplary epitaxial SiGe material may have a germanium content of from about 20% to about 70% (by weight based on the total weight of the material). The in-situ doped epitaxial material exhibits a relatively fast growth rate on the non-selected surfaces 86 and 88 of the material layer 80. Further, the in-situ doped epitaxial material exhibits a relatively slow growth rate, such as a near zero growth rate, on the selected facets 82 of the material layer 80. However, as shown, dopant atoms are condensed from the dopant source, or otherwise form on the selected facets 82 of the material layer 80 to form a layer 92 of increased dopant concentration on each selected facet 82. By "increased dopant concentration" it is meant that layer 92 has a higher dopant concentration than layer 90. For example, boron atoms may condense from a boron source to form a layer 92 of increased boron concentration. The layers 92 of increased dopant concentration are believed to include interstitial atoms of the dopant on the selected facets 82. As a result, the layers 92 of increased dopant concentration include a higher concentration of dopant atoms than the layer 90 of in-situ doped epitaxial material formed on the non-selected surfaces 86 and 88. For example, the layer 90 of in-situ doped epitaxial material may have a dopant concentration of from about 1E19 to about 8E20, while the layers 92 of increased dopant concentration may have a dopant concentration of from about 1E21 to about 1E22.

While the process of FIG. 6 has been described as separate and distinct from the process of FIG. 5, it is contemplated that a single eptitaxy/deposition process be performed. Specifically, a first stage of a single deposition process may be performed to grow the epitaxial material to form the material layer in FIG. 5, and a second stage of the single deposition process may be performed to grow the layer 90 of in-situ doped epitaxial material and the layers 92 of increased dopant concentration. Flow of the dopant source is either commenced or increased at the second stage in order to form the layer 90 of in-situ doped epitaxial material and the layers 92 of increased dopant concentration.

In FIG. 7, the method continues and includes filling the cavity 74 with epitaxial material to form active regions as in conventional processing. In the illustrated embodiment, an epitaxial deposition process is performed to grow epitaxial material 94 on the layer 90 of in-situ doped epitaxial material and on the layers 92 of increased dopant concentration. An exemplary epitaxial material 94 is SiGe having a germanium content of from about 40% to about 50% (by weight based on the total weight of the material). The epitaxial material 94 may be doped, such as with the same dopant in the layer 90 of in-situ doped epitaxial material and the layers 92 of increased dopant concentration. The epitaxial deposition process may be performed at process conditions including a temperature of from about 550 to about 750° C., a pressure of from about 1 to about 300 T, and with a mixture of process gases including diclorosilane (DCS), germane ($GeH_4$), diborane ($B_2H_6$), hydrogen chloride (HCl) and/or hydrogen ($H_2$).

As shown in FIG. 7, a capping layer 96 may be formed over the epitaxial material 94. The capping layer 96 may be formed from epitaxial material, such as SiGe. An exemplary epitaxial material is SiGe having a germanium content of from about 0% to about 30% (by weight based on the total weight of the material). In an exemplary embodiment, the capping layer 96 is doped with the same dopant as the layer 90 of in-situ doped epitaxial material and on the layers 92 of increased dopant concentration. As illustrated, the capping layer 96 is not formed within the cavity 74, rather it is positioned over the surface of the silicon layer 38. The capping layer 96, epitaxial material 94, layer 90 of in-situ doped epitaxial material, layers 92 of increased dopant concentration, and material layer 80 collectively form an active region, such as a source/drain region.

Figure 8:
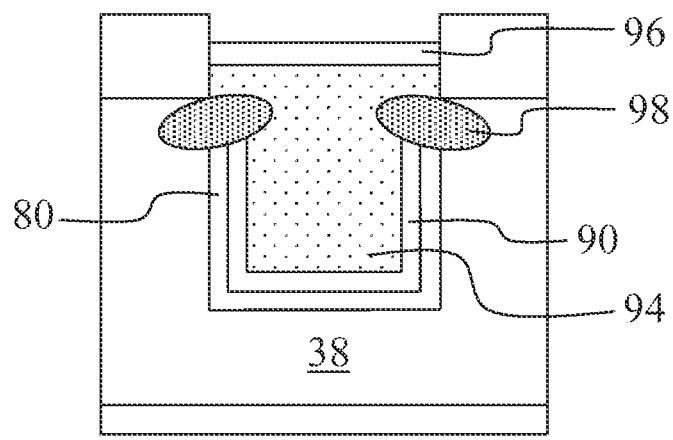

In FIG. 8, a thermal process is performed to diffuse the dopant from the layers 92 of increased dopant concentration to form diffused regions 98 of increased dopant concentration. For example, an annealing process such as a rapid thermal anneal may be performed at a temperature of from about 700 to about 1150° C. for a duration of from about 10 to about 300 seconds. Dopant is diffused into the epitaxial material 94, the layer 90 of in-situ doped epitaxial material, the material layer 80, and the silicon layer 38.

The method illustrated in FIG. 1-8 includes the formation of a conventional cavity with substantially vertical sidewalls formed by anisotropic etching of the silicon layer. However, the methods for forming layers of increased dopant concentration are not limited to a specific cavity shape. In FIGS. 9-12, a method is described in which a "sigma-shaped" cavity 74 is formed in the silicon layer 38. As shown in FIG. 9, the sigma-shaped cavity 74 has an opening 75, downward-facing upper surfaces 79, upward-facing side surfaces 78, and a bottom surface 76. A maximum width having a greater diameter than the diameter of the opening 75 is formed at the interface of the downward-facing upper surfaces 79 and upward-facing side surfaces 78. The formation of the sigma-shaped cavity 74 is performed using known conventional techniques, such as with etchants having different etch rates for different crystalline planes.

In FIG. 10, a material layer 80 is formed in the sigma-shaped cavity 74. The material layer 80 may serve as a buffer layer to facilitate deposition of overlying layers. An exemplary material layer 80 is formed with a varying thickness of from about 1 to about 10 nm. In an exemplary embodiment, an epitaxial material is grown on the bottom surface 76 and side surfaces 78 of the cavity 74 to form the material layer 80. The epitaxial material may be SiGe having a germanium content of from about 20% to about 25% (by weight based on the total weight of the material). An exemplary epitaxial material is not doped, or is lightly doped, with n-type or p-type impurities. The epitaxial material may have a dopant content of no more than about 1E20 $cm^{-3}$. The epitaxial material may be grown under process conditions such as a temperature of from about 550 to about 750° C., a pressure of from about 50 to about 300 T, with a mixture of process gases including diclorosilane (DCS), germane ($GeH_4$), diborane ($B_2H_6$), hydrogen chloride (HCl) and/or hydrogen ($H_2$).

During the epitaxial deposition process, the material layer 80 is formed along crystalline planes to form a non-planar non-selected surface 86. In the embodiment of FIGS. 9-12, each selected facet 82 is formed by a downward-facing upper surface 79. Alternatively, each selected facet 82 may be formed by material layer 80 formed on the downward-facing upper surfaces 79. In an exemplary embodiment, each selected facet 82 is on the (111) crystalline plane.

Similar to the processing described in relation to FIGS. 5-8, in FIG. 11, an epitaxial deposition process is performed with processing conditions different from those of FIG. 10. For example, in FIG. 11 a flow of a dopant source into the cavity 74 is commenced, or increased from the process of FIG. 10. In an exemplary embodiment, the dopant source is a boron source such as $B_2H_6$, $B_4H_9$, and/or $B_5H_{10}$. The epitaxial deposition process may be performed at process conditions including a temperature of from about 550 to about 750° C., a pressure of from about 1 to about 100 T, and with a mixture of process gases including diclorosilane (DCS), germane ($GeH_4$), diborane ($B_2H_6$), hydrogen chloride (HCl) and/or hydrogen ($H_2$).

As shown, a layer 90 of in-situ doped epitaxial material, such as in-situ boron-doped epitaxial SiGe material, is formed on the material layer 80 in FIG. 11 as a result of the epitaxial deposition process. An exemplary epitaxial SiGe material may have a germanium content of from about 40% to about 50% (by weight based on the total weight of the material). The in-situ doped epitaxial material exhibits a relatively fast growth rate on the non-selected surface 86 of the material layer 80. Further, the in-situ doped epitaxial material exhibits a relatively slow growth rate, such as a near zero growth rate, on the selected facets 82.

However, as shown, dopant atoms are condensed from the dopant source, or otherwise form on the selected facets 82 of the material layer 80 to form a layer 92 of increased dopant concentration on each selected facet 82. The layers 92 of increased dopant concentration are believed to include interstitial atoms of the dopant on the selected facets 82. As a result, the layers 92 of increased dopant concentration include a higher concentration of dopant atoms than the layer 90 of in-situ doped epitaxial material formed on the non-selected surfaces 86. For example, the layer 90 of in-situ doped epitaxial material may have a dopant concentration of from about 1E19 to about 8E20, while the layers 92 of increased dopant concentration may have a dopant concentration of from about 1E21 to about 1E22.

While the process of FIG. 11 has been described as separate and distinct from the process of FIG. 10, it is contemplated that a single process be performed. Specifically, a first stage of a single deposition process may be performed to grow the epitaxial material to form the material layer in FIG. 10, and a second stage of the single deposition process may be performed to grow the layer 90 of in-situ doped epitaxial material and the layers 92 of increased dopant concentration. Flow of the dopant source is either commenced or increased at the second stage in order to form the layer 90 of in-situ doped epitaxial material and the layers 92 of increased dopant concentration.

In FIG. 12, the method continues and includes filling the cavity 74 with epitaxial material to form active regions as in conventional processing. In the illustrated embodiment, an epitaxial deposition process is performed to grow epitaxial material 94 on the layer 90 of in-situ doped epitaxial material and on the layers 92 of increased dopant concentration. An exemplary epitaxial material 94 is SiGe having a germanium content of from about 40% to about 50% (by weight based on the total weight of the material). The epitaxial material 94 may be doped, such as with the same dopant in the layer 90 of in-situ doped epitaxial material and on the layers 92 of increased dopant concentration. The epitaxial deposition process may be performed at process conditions including a temperature of from about 550 to about 750° C., a pressure of from about 1 to about 300 T, and with a mixture of process gases including diclorosilane (DCS), germane ($GeH_4$), diborane ($B_2H_6$), hydrogen chloride (HCl) and/or hydrogen ($H_2$).

As shown in FIG. 12, a capping layer 96 may be formed over the epitaxial material 94. The capping layer 96 may be formed from epitaxial material, such as SiGe. In an exemplary embodiment, the capping layer 96 is doped with the same dopant as the layer 90 of in-situ doped epitaxial material and on the layers 92 of increased dopant concentration. As illustrated, the capping layer 96 is not formed within the cavity 74, rather it is positioned over the surface of the silicon layer 38. The capping layer 96, epitaxial material 94, layer 90 of in-situ doped epitaxial material, layers 92 of increased dopant concentration, and material layer 80 collectively form an active region, such as a source/drain region.

In FIG. 12, a thermal process is performed to diffuse the dopant from the layers 92 of increased dopant concentration to form diffused regions 98 of increased dopant concentration. For example, an annealing process such as a rapid thermal anneal may be performed at a temperature of from about 700 to about 1150° C. for a duration of from about 10 to about 300 seconds. Dopant is diffused into the epitaxial material 94, the layer 90 of in-situ doped epitaxial material, the material layer 80, and the silicon layer 38.

Although not illustrated, the structures illustrated in FIGS. 8 and 12 can be completed in conventional manner. Conventional processing may include, for example, contact formation, stressing processes, deposition of dielectric and metal layers, and other back end of line (BEOL) processes. It should be understood that various processes may be utilized in further processing, and the subject matter described herein is not limited to any particular number, combination, or arrangement of processes or structures.

As a result of the processes described above, the diffused regions 98 of increased dopant concentration are more precisely positioned in the integrated circuit 10. Specifically, layers of increased dopant concentration are selectively located in the integrated circuit 30 without lithography limitations imparted by photomasks. Diffusion from the layers of increased dopant concentration may then be performed.

Selective location of the layers of increased dopant concentration is provided by utilizing different growth rates of epitaxial material on different crystalline planes. Slow growth of epitaxial material on selected facets allows for condensation or formation of dopant atoms over the selected facets, such as at interstitial positions.

The present fabrication method provides for in-situ doping at sub-lithographic scale. In addition, the present method reduces the number of implantation processes as compared to typical fabrication processes, reducing costs.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A method for fabricating an integrated circuit, the method comprising:
   forming a material layer with a selected facet on a selected plane and a non-selected facet on a non-selected plane; and
   performing an epitaxial deposition process with a dopant source to grow an in-situ doped epitaxial material on the material layer, wherein the epitaxial deposition process grows the in-situ doped epitaxial material on the selected facet at a first growth rate and over the non-selected facet at a second growth rate greater than the first growth rate, and wherein a layer of increased dopant concentration is selectively formed over the selected facet.

2. The method of claim 1 further comprising:
   performing another epitaxial deposition process to grow an additional epitaxial material on the in-situ doped epitaxial material; and
   performing a thermal anneal process to diffuse dopant from the layer of increased dopant concentration.

3. The method of claim 1 wherein forming the material layer having the selected facet on the selected plane comprises forming the material layer having the selected facet on the (111) plane.

4. The method of claim 1 further comprising:
providing a semiconductor substrate having an active substrate region; and
etching the active substrate region to form a cavity, wherein forming the material layer having the selected facet on the selected plane and the non-selected facet on the non-selected plane comprises forming the material layer in the cavity.

5. The method of claim 4 wherein forming the material layer having the selected facet on the selected plane and the non-selected facet on the non-selected plane comprises growing an epitaxial buffer layer on the active substrate region in the cavity.

6. The method of claim 5 wherein performing the epitaxial deposition process with the dopant source to grow the in-situ doped epitaxial material on the material layer comprises performing the epitaxial deposition process with a boron source to grow in-situ boron-doped silicon germanium epitaxial material and to form the layer of increased dopant concentration with increased boron concentration over the selected facet.

7. The method of claim 6 further comprising:
performing another epitaxial deposition process to grow an additional epitaxial material over the in-situ boron-doped silicon germanium epitaxial material; and
performing a thermal anneal process to diffuse boron from the layer of increased dopant concentration into the semiconductor substrate.

8. The method of claim 7 further comprising performing a further epitaxial deposition process to grow a capping epitaxial material over the additional epitaxial material.

9. The method of claim 1 further comprising:
providing a semiconductor substrate having an active substrate region;
etching the active substrate region to form a cavity; and
epitaxially growing a buffer material in the cavity, wherein forming the material layer having the selected facet on the selected plane and the non-selected facet on the non-selected plane comprises forming the material layer in the cavity and over the buffer material.

10. The method of claim 1 further comprising:
providing a semiconductor substrate having an active substrate region;
etching the active substrate region to form a cavity, wherein the cavity has an opening with a first diameter and a maximum width with a second diameter greater than the first diameter such that the cavity is formed with a downward-facing surface, wherein forming the material layer having the selected facet on the selected plane comprises forming the selected facet on the downward-facing surface.

11. A method for fabricating an integrated circuit, the method comprising:
establishing a selected facet on a selected plane and a non-selected surface in and/or overlying a semiconductor substrate; and
performing an epitaxial deposition process with a dopant source to grow an in-situ doped epitaxial material on the non-selected surface, wherein the epitaxial deposition process selectively deposits interstitial dopant atoms over the selected facet to form a layer of increased dopant concentration over the selected facet.

12. The method of claim 11 wherein performing the epitaxial deposition process comprises selectively forming the layer of increased dopant concentration over the selected facet on the (111) plane.

13. The method of claim 11 wherein performing the epitaxial deposition process with the dopant source comprises performing the epitaxial deposition process with a boron source to grow in-situ boron-doped silicon germanium epitaxial material on the non-selected surface and to form the layer of increased dopant concentration with increased boron concentration over the selected facet.

14. The method of claim 11 wherein the epitaxial deposition process grows the in-situ doped epitaxial material over the selected facet at a first growth rate and over the non-selected surface at a second growth rate greater than the first growth rate.

15. The method of claim 11 wherein establishing the selected facet on the selected plane and the non-selected surface in and/or overlying the semiconductor substrate comprises etching the semiconductor substrate to form a cavity, wherein a selected facet on a selected plane and a non-selected surface are defined within the cavity.

16. The method of claim 15 further comprising forming a material layer in the cavity, wherein the selected facet and the non-selected surface are defined on the material layer.

17. The method of claim 15 further comprising:
performing another epitaxial deposition process to grow an additional epitaxial material on the in-situ doped epitaxial material;
performing a further epitaxial deposition process to grow a capping epitaxial material over the additional epitaxial material; and
performing a thermal anneal process to diffuse dopant from the layer of increased dopant concentration into the semiconductor substrate.

18. The method of claim 15 wherein etching the semiconductor substrate to form the cavity comprises forming the cavity with a downward-facing surface, wherein the downward-facing surface defines the selected facet on the selected plane.

19. The method of claim 18 further comprising epitaxially growing a buffer material in the cavity, wherein the buffer material defines the non-selected surface.

20. A method for fabricating an integrated circuit, the method comprising:
providing a semiconductor substrate;
etching the semiconductor substrate to form a cavity and epitaxially growing a buffer material in the cavity, wherein a selected facet on the (111) plane and a non-selected surface are defined within the cavity;
performing an epitaxial deposition process with a boron source to grow an in-situ boron-doped epitaxial material in the cavity, wherein the epitaxial deposition process grows the in-situ boron-doped epitaxial material over the selected facet at a first growth rate and over the non-selected surface at a second growth rate greater than the first growth rate, and wherein the epitaxial deposition process selectively forms a layer of increased boron concentration over the selected facet;
performing another epitaxial deposition process to grow an additional epitaxial material on the in-situ boron-doped epitaxial material;
performing a further epitaxial deposition process to grow a capping epitaxial material over the additional epitaxial material; and
performing a thermal anneal process to diffuse boron from the layer of increased boron concentration into the semiconductor substrate.

* * * * *